United States Patent [19]
Strickler

[11] Patent Number: 6,163,454
[45] Date of Patent: Dec. 19, 2000

[54] ELECTROMAGNETIC INTERFERENCE (EMI) SHIELD FOR ELECTRICAL COMPONENTS, AN INTERNAL EMI BARRIER, AND A STORAGE ENCLOSURE FOR ELECTRICAL/ELECTRONIC COMPONENTS

[75] Inventor: Mike Strickler, Boise, Id.

[73] Assignee: Hewlett-Packard Company, Palo Alto, Calif.

[21] Appl. No.: 09/255,408

[22] Filed: Feb. 22, 1999

[51] Int. Cl.[7] ............................... H05K 7/20; H05K 9/00
[52] U.S. Cl. ........................ 361/695; 174/35 R; 361/818
[58] Field of Search .......................... 174/35 R, 35 GC, 174/35 MS; 361/687, 692–695, 800, 816, 818

[56] References Cited

U.S. PATENT DOCUMENTS

| | | | |
|---|---|---|---|
| 5,049,701 | 9/1991 | Vowles et al. ............................... | 174/35 |
| 5,193,050 | 3/1993 | Dimmick et al. ......................... | 361/695 |
| 5,294,748 | 3/1994 | Schwenk et al. ........................... | 174/35 |
| 5,483,423 | 1/1996 | Lewis et al. .............................. | 361/816 |
| 5,704,117 | 1/1998 | Mok et al. ................................. | 29/841 |
| 5,734,561 | 3/1998 | Wolf et al. ............................... | 361/800 |
| 5,737,194 | 4/1998 | Hopkins et al. ......................... | 361/800 |
| 5,912,799 | 6/1999 | Grouell et al. ........................... | 361/692 |
| 5,991,163 | 11/1999 | Marconi et al. .......................... | 361/800 |
| 5,999,365 | 12/1999 | Hasegawa et al. ...................... | 361/818 |

*Primary Examiner*—Gregory Thompson

[57] ABSTRACT

A storage enclosure is provided for electrical/electronic components. The storage enclosure includes an enclosure, an EMI barrier, air flow inlet apertures and exhaust air flow apertures. The enclosure has at least one wall configured to house an electrical/electronic component. The EMI barrier wall has air flow apertures sized sufficiently small to prevent passage of undesirable relatively high frequency EMI/RFI emissions. The barrier wall is supported internally of the enclosure and is configured to subdivide the enclosure into a component enclosure and a cooling fan module enclosure. The air flow inlet apertures are provided in the component enclosure to draw cooling air into the component enclosure and cool components contained therein. The exhaust air flow apertures are sized larger than the EMI barrier apertures and the air flow inlet apertures, and are provided in the cooling fan module enclosure to expel cooling air from the cooling fan module out of the storage enclosure. The component enclosure is configured to contain relatively high frequency EMI/RFI emissions that emanate from components contained therein, and the cooling fan module enclosure is configured to contain relatively low frequency EMI/RFI emissions that emanate from a fan module contained therein while providing for a relatively large passage of cooling air from the storage enclosure. A method is also provided.

20 Claims, 4 Drawing Sheets

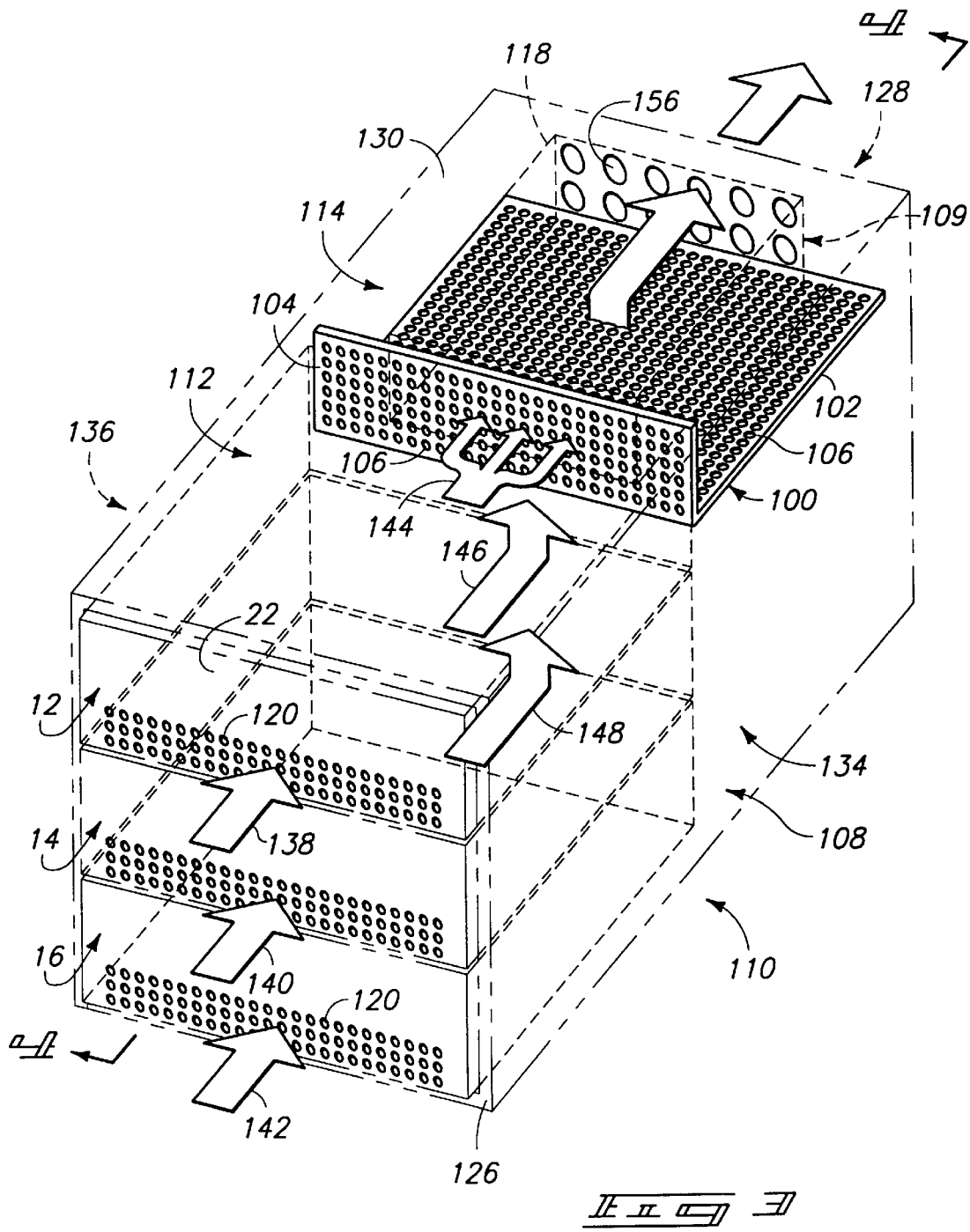

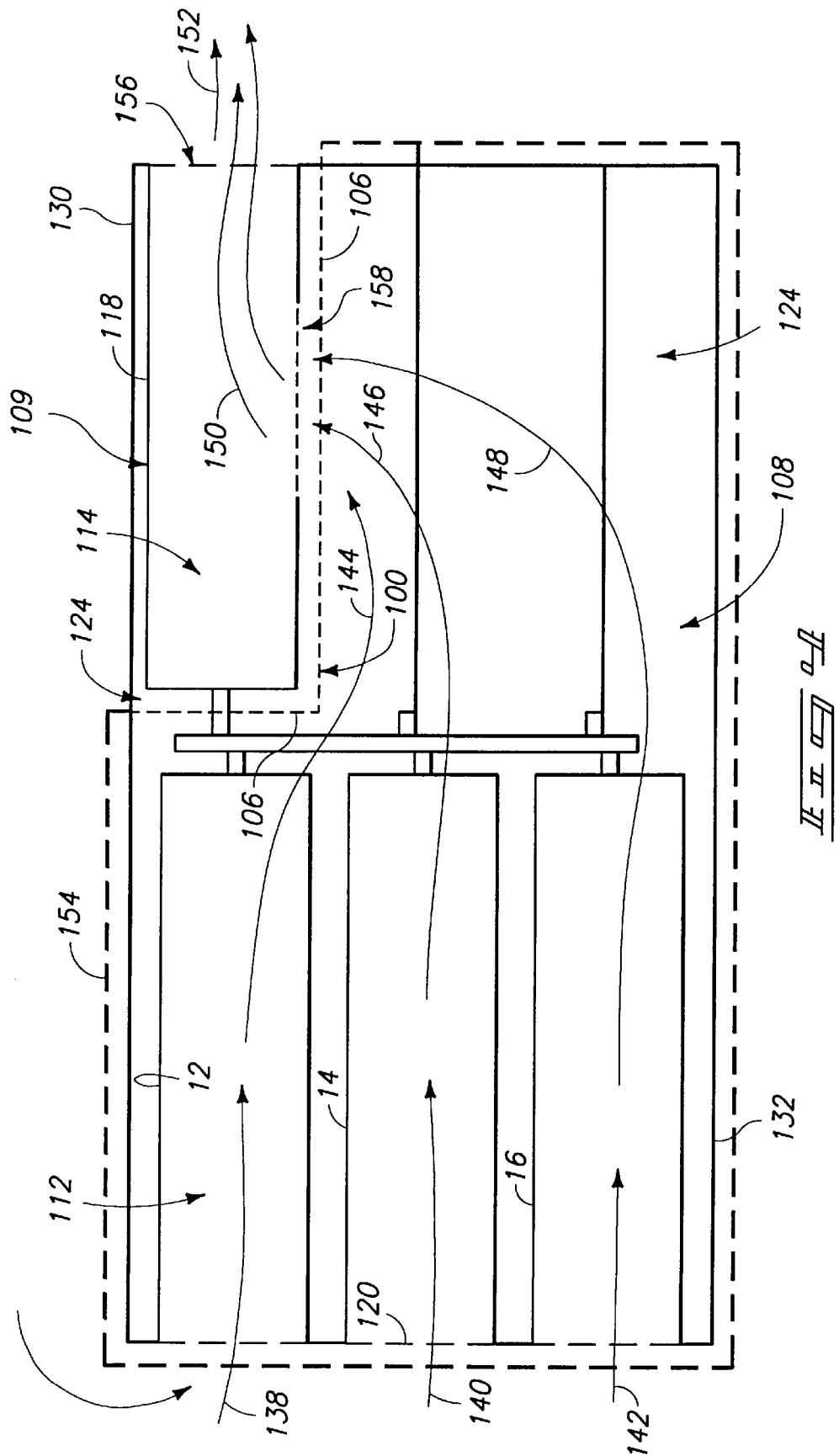

ELECTROMAGNETIC INTERFERENCE (EMI) SHIELD FOR ELECTRICAL COMPONENTS, AN INTERNAL EMI BARRIER, AND A STORAGE ENCLOSURE FOR ELECTRICAL/ELECTRONIC COMPONENTS

FIELD OF THE INVENTION

This invention relates to electromagnetic interference (EMI) shielding, and more particularly, to an equipment enclosure having an internal EMI barrier that separates a cooling fan module from relatively high frequency modules/components while improving air flow.

BACKGROUND OF THE INVENTION

Enclosures for containing and supporting electrical and electronic components are designed to meet several important requirements. One requirement is to provide physical support and protection to electrical assemblies contained therein. Another requirement is to shield electromagnetic interference (EMI) so that it does not interfere with the operation of specific components. Yet another requirement is to provide a cooling air flow through the enclosure to in order to remove heat that is generated by operating components.

One exemplary enclosure comprises a rack mountable storage enclosure, sometimes referred to as an equipment cabinet, for supporting electronic and electrical insertable units or components. A typical rack mountable storage enclosure, designed for the high-availability market, is equipped with multiple fan modules in order to provide a redundant air flow cooling system that is highly reliable and unlikely to fail. Such storage enclosures are also provided with EMI shielding. The fan modules are mounted inside the storage enclosure, typically in the back, and are easily replaced when one module fails. The storage enclosure is typically designed with an air plenum that draws air through individual internal components via the air flow cooling system. The air flow cooling system is typically designed such that individual components are sufficiently cooled, even if one of the fan modules fails. Hence, the operating system contained within the enclosure may continue to run, even when one of the fan modules has failed to operate. Accordingly, such failed fan module is subsequently replaced without incurring a total loss of cooling capacity.

The housing of electrical components, such as computers and test equipment, within rack mountable storage enclosures has led to numerous techniques for shielding the internally housed electrical assemblies or components. It is desirable to prevent electromagnetic fields generated by these assemblies from propagating and interfering with other electrical equipment operating in the vicinity. For purposes of this disclosure, the term electromagnetic interference (EMI) is understood to refer to electromagnetic emission and radiation that includes both electromagnetic interference (EMI) and radio-frequency interference (RFI). Both of these types of interference generate electromagnetic fields that can interfere with the operation of adjacent electrical equipment. Storage cabinets designed to shield such interference are commonly known as EMI cabinets.

One prior art storage enclosure having an EMI barrier and cooling fan module is illustrated in FIG. 1. More particularly, an EMI storage enclosure 10 is shown in partial phantom lines to illustrate the manner in which a plurality of electrical/electronic components 12, 14 and 16 are EMI shielded and cooled therein. A single cooling fan module 18 is shown supported within an upper rear corner of enclosure 10. However, it is understood that some prior art constructions utilize a plurality of cooling fan modules 18 supported along a rear portion of enclosure 10. Additionally, enclosure 10 is constructed such that individual face panels 22 of components 12–16 are sealed with individual EMI gaskets (not shown) along a front peripheral edge portion extending about enclosure 10 so as to form a front panel 26.

Optionally, an EMI shielded door can be hingedly attached to one edge of front panel 26 and sealed with EMI gaskets there along to suppress EMI/RFI emissions during normal operation, and to permit access to components housed within enclosure 10. U.S. Pat. No. 5,049,701 to Vowles et al. teaches an EMI enclosure having a front door for carrying rail-supported components therein, and is herein incorporated by reference.

Where individual face panels 22 are used to form at least part of front panel 26, it is necessary to provide EMI shielded joints between the face panels 22 and leading edge of front panel 26. U.S. Pat. No. 5,294,748 to Schwenk et al., herein incorporated by reference, discloses the use of contact strips formed from an electrically well-conducting material interposed between panels, and extending along joints formed therebetween. Other EMI gasket constructions are known in the art. U.S. Pat. Nos. 5,483,423; 5,704,117; and 5,734,561 show additional techniques for imparting EMI shielding along a joint or connection, and are herein incorporated by reference.

As shown in FIG. 1, EMI storage enclosure 10 includes a framework (not shown) comprising a plurality of frame members onto which face panels 22, front panel 26, back panel 28, top panel 30, bottom panel 32, and side panels 34 and 36 are secured in a manner that suppresses EMI/RFI emissions. One technique for affixing such panels uses a strip of conductive finger-like springs to form a wiping electrical contact between the panels and framework. Other techniques are also well understood in the art including welding individual panels together, or to the framework. It is also understood that a plurality of horizontally extending rails are formed along inner-surfaces of panels 28, 34 and 36 for supporting rack-mounted electrical/electronic components, such as components 12, 14 and 16.

Also shown in FIG. 1, a plurality of inlet apertures 20 are formed in front panel 26; namely, in individual face panels 22. Apertures 20 allow cooling air to be drawn from outside enclosure 10 and through front panel 26 via inlet air flow paths 38, 40 and 42. Apertures 20 can be round, elliptical or any suitable shape. More particularly, cooling fan module 18 contains a motor-driven fan that draws air through inlet apertures 20, within individual components 12–16, exiting components 12–16 via outlet air flow paths 44, 46 and 48, and into a common air plenum 26. Cooling fan module 18 then draws air from within plenum 24, via a cooling module flow path 50, and forces the drawn air out through back panel 28 of enclosure 10 via a common outlet flow path 52 provided by a plurality of relatively small sized exhaust apertures 56.

FIG. 2 illustrates the prior art storage enclosure 10 of FIG. 1 in vertical-sectional view taken lengthwise. A fan inlet port 58 is shown communicating with a relatively large air plenum 44 that is formed in an inner portion of enclosure 10, behind components 12–16. The flow of cooling air through enclosure 10, as moved by fan module 18, is clearly shown in FIG. 2. Cool air is drawn into enclosure 10, and into individual components 12–16 via inlet paths 38, 40 and 42. Apertures (not shown) are provided in the rear of each component 12–16 such that cooling air, now slightly heated, leaves components 12–16 via outlet paths 44, 46 and 48 and enters a common enclosure or air plenum 24. Cooling fan module 18 withdraws the slightly heated cooling air from plenum 24 through port 58 and ejects the air from enclosure 10 via the plurality of relatively small exhaust apertures 56 formed in back panel 28, adjacent cooling fan module 18.

Pursuant to the construction of enclosure 10 depicted in FIGS. 1 and 2, an electromagnetic interference (EMI) barrier 54 is provided by enclosure 10. Inlet apertures 20 and exhaust apertures 56 are dimensioned with a size that prevents escape of undesirable frequencies of electromagnetic interference (EMI) and radio-frequency interference (RFI) from enclosure 10. For example, smaller aperture sizes are needed to prevent escape of higher frequency components emanating from electromagnetic fields generated by operating components contained within enclosure 10. The escape of such high frequency components, or the escape of any electromagnetic/radio-frequency waves, can interfere with the operation of other electrical/electronic equipment that is adjacent to, but outside of, enclosure 10. Accordingly, it is well understood in the art to appropriately size and shape inlet apertures 20 and exhaust apertures 56 so as to prevent escape of undesirable EMI/RFI components.

However, there have been recent desires to minimize the size of rack mounted storage systems, or enclosures. More particularly, market pressures have caused manufacturers of storage enclosures to reduce the size of rack mounted storage systems. As a result, the surface area available on the rear face, or panel, of many storage enclosures has become smaller and smaller. Hence, the surface area available for exhausting cooling air from the enclosure has been significantly reduced, which means that cooling fan modules are required to more forcibly exhaust cooling air through a more limited number of exhaust apertures provided across a smaller surface area.

Additionally, there has been a change in how individual components are signal coupled together within a storage enclosure. In the past, components within a storage enclosure were coupled together using Small Computer System Interface (SCSI). Recently, Fibre channel technology, such as fiber optic cables and connectors, have been used to connect together components within a storage enclosure. However, Fibre channel technology generally generates electromagnetic interference (EMI) emissions at much higher frequencies than SCSI technology.

In order for a storage enclosure, such as enclosure 10 of FIG. 1, to contain these higher frequencies, the hole sizes for inlet apertures 20 and exhaust apertures 56 are required to be very small. However, reducing the size of apertures 20 and 56 can significantly restrict the ability of cooling fan module 18 to push exhausted cooling air through exhaust apertures 56, via outlet flow path 52. For most designs, front panel 26 contains sufficient surface area in order to increase the number of smaller-sized inlet apertures 20. However, the above-mentioned efforts to reduce the size of storage enclosures usually results in insufficient surface area being provided in back panel 28, along cooling fan module 18, in order to increase the number of smaller-sized exhaust apertures 56.

To make matters worse, the fans within cooling fan modules are required to blow, or push, cooling air through these relatively smaller-sized exhaust apertures, which proves to be much more difficult and inefficient than drawing cooling air through these smaller-sized exhaust apertures. As a result, recent attempts to reduce the hole size of exhaust apertures has generated a loss of margin, or inefficiency, in volumetric air flow which has reduced heat dissipation from storage enclosures.

Accordingly, there exists a need to provide an improved storage enclosure having an EMI/RFI barrier suitable to restrict propagation of higher-frequency emissions from within the storage enclosure to the exterior of the storage enclosure.

There exists a further need to provide a storage enclosure capable of shielding internal components from relatively low frequency emissions generated by a cooling fan module, while still enabling an efficient flow of cooling air through the storage enclosure.

There exists even a further needed to provide a technique for shielding, or separating, components within a storage enclosure such that EMI/RFI emissions from one component are prevented from interfering with a second component.

SUMMARY OF THE INVENTION

An electromagnetic interference (EMI) shielded storage enclosure includes an internal EMI barrier contained within the enclosure and configured to separate one or more cooling fan modules from relatively high frequencies modules/components for the purpose of improving the flow of cooling air through the storage enclosure.

According to one aspect of the invention, a storage enclosure is provided for electrical/electronic components. The storage enclosure includes an enclosure, an EMI barrier, air flow inlet apertures and exhaust air flow apertures. The enclosure has at least one wall configured to house an electrical/electronic component. The EMI barrier wall has air flow apertures sized sufficiently small to prevent passage of undesirable relatively high frequency EMI/RFI emissions. The barrier wall is supported internally of the enclosure and is configured to subdivide the enclosure into a component enclosure and a cooling fan module enclosure. The air flow inlet apertures are provided in the component enclosure to draw cooling air into the component enclosure and cool components contained therein. The exhaust air flow apertures are sized larger than the EMI barrier apertures and the air flow inlet apertures, and are provided in the cooling fan module enclosure to expel cooling air from the cooling fan module and out of the storage enclosure. The component enclosure is configured to contain relatively high frequency EMI/RFI emissions that emanate from components contained therein, and the cooling fan module enclosure is configured to contain relatively low frequency EMI/RFI emissions that emanate from a fan module contained therein while providing for a relatively large passage of cooling air from the storage enclosure.

According to another aspect of the invention, an electromagnetic interference (EMI) shield is provided for electrical components. The shield includes an enclosure, a barrier wall, and apertures. The enclosure is formed from at least one wall. The barrier wall is supported internally of the enclosure so as to subdivide the enclosure into a component enclosure and a fan module enclosure. The apertures are provided in the component enclosure and the barrier wall to allow cooling air to be drawn in from outside of the enclosure through the component enclosure and out through the fan module enclosure. The apertures in the component enclosure and the barrier wall are sized smaller than the apertures in the fan module enclosure.

According to yet another aspect of the invention, a method is included for shielding electrical components contained within an EMI cabinet. The method provides an EMI cabinet having relatively small sized apertures configured to draw in cooling air and relatively large sized apertures configured to expel cooling air from the EMI cabinet. The method also provides a barrier wall within the EMI cabinet having relatively small sized apertures, the barrier wall being configured to subdivide the EMI cabinet into a component enclosure and a fan module enclosure. In addition, an electrical component is provided within the component enclosure and a fan module is provided within the fan module enclosure, wherein the relatively small sized apertures in the component enclosure of the EMI cabinet and the barrier wall are sized to contain relatively high-frequency noise emanating from the electrical component, and the relatively large sized apertures in the fan module enclosure of the EMI cabinet are sized to contain relatively lower-frequency noise emanating from the fan module while also providing sufficient air flow for evacuating cooling air from the EMI cabinet.

One advantage of Applicant's invention is the ability to electromagnetically shield relatively high-frequency modules/components within an EMI storage enclosure along with a relatively low frequency cooling fan module such that devices outside the storage enclosure do not receive interfering EMI/RFI emissions from the modules/components or the cooling fan module.

An additional advantage is to provide the above-mentioned advantage, while additionally providing sufficient cooling air flow through the storage enclosure via one or more cooling fan modules.

DESCRIPTION OF THE DRAWINGS

Preferred embodiments of the invention are described below with reference to the following accompanying drawings depicting examples embodying the best mode for practicing the invention.

FIG. 3 is a simplified perspective of a storage cabinet having an EMI shield formed within the cabinet and configured to separate a cooling fan module from other relatively high frequency modules/components contained within the cabinet in a manner that improves cooling air flow through the cabinet in accordance with one embodiment of the invention.

FIG. 4 is a simplified vertical-sectional view taken along line 4—4 of FIG. 3.

DETAILED DESCRIPTION OF THE INVENTION

Figure 1:
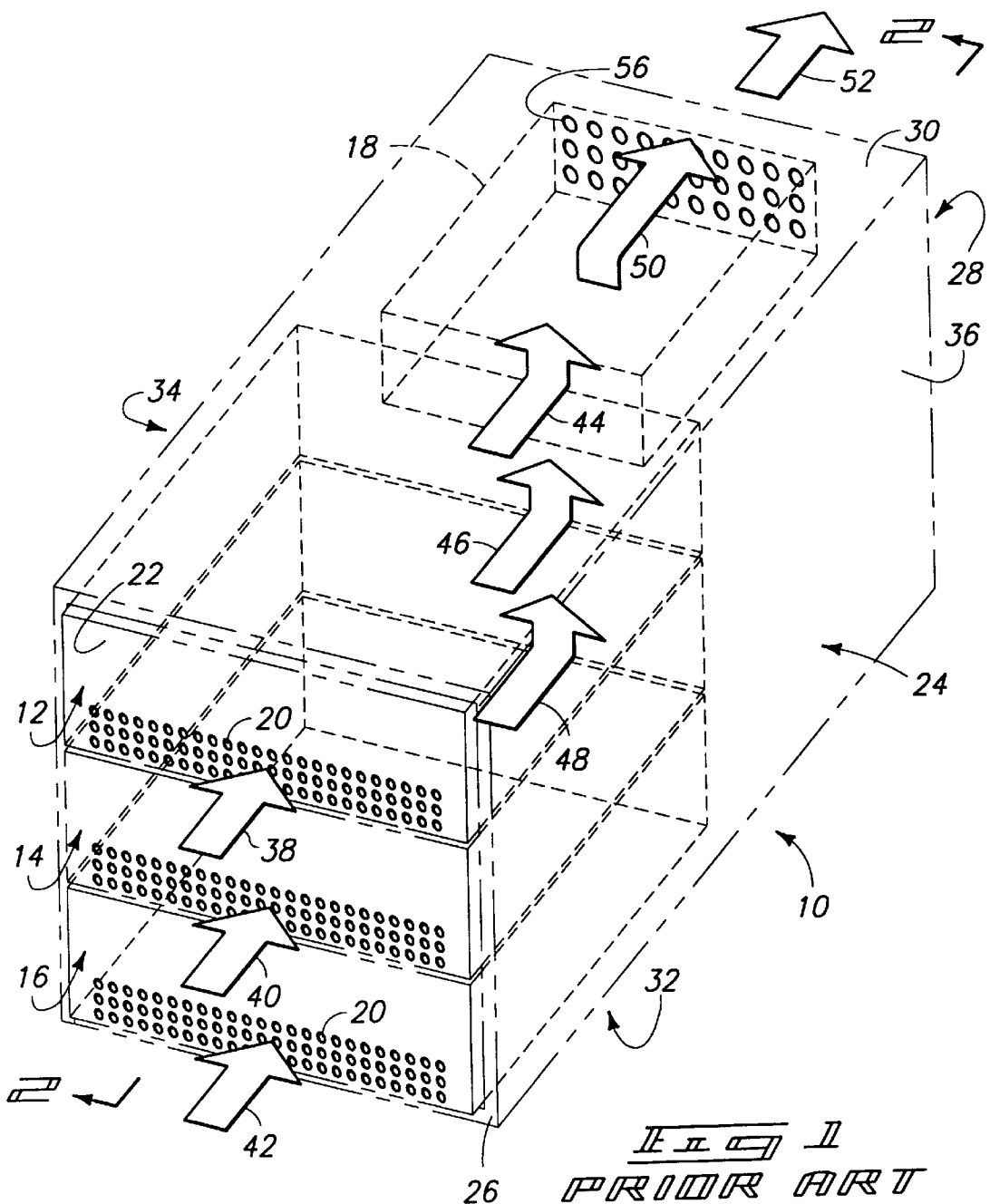
FIG. 1 is a simplified perspective view of a prior art storage cabinet having an EMI barrier and cooling fan module with the storage cabinet shown in phantom and illustrating the path of cooling air flow traveling through the storage cabinet.

This disclosure of the invention is submitted in furtherance of the constitutional purposes of the U.S. Patent Laws "to promote the progress of science and useful arts". U.S. Constitution, Article 1, Section 8.

A storage enclosure having an EMI barrier and cooling fan module configured with the inventive features of Applicant's invention is illustrated in FIGS. 3 and 4, and is identified by reference numeral 110. More particularly, an EMI storage enclosure 110 is shown in partial phantom lines to illustrate the manner in which a plurality of electrical/electronic components 12, 14 and 16 are EMI shielded and air cooled. Enclosure 110 is similar in construction to enclosure 10 of FIGS. 1 and 2, aside from the novel features described below.

A single cooling fan module 118 is shown supported within an upper rear corner of enclosure 110. It is understood that an alternative construction can utilize a plurality of cooling fan modules 118 supported along a rear portion of enclosure 10. However, such alternative construction will not be as compact. Additionally, enclosure 110 is constructed such that individual face panels 22 of components 12–16 are sealed with individual EMI gaskets (not shown) with a front peripheral edge portion extending about enclosure 10 so as to form front panel 126. Optionally, an EMI shielded door can be hingedly attached to one edge of front panel 126 and sealed with EMI gaskets there along to suppress EMI/RFI emissions during normal operation, and to permit access to components housed within enclosure 110.

For the case where individual face panels 22 form front panel 126, it is necessary to provide EMI shielded joints between the face panels 22 and leading edge of front panel 126. As was discussed with the prior art, a number of gasket constructions are known in the art. One technique involves welding together the panels along adjacent edges with a continuous weld.

As shown in FIG. 1, EMI storage enclosure 110 includes a framework (not shown) comprising a plurality of frame members onto which a plurality of walls comprising face panel 122, front panel 126, back panel 128, top panel 130, bottom panel 132, and side panels 134 and 136 are secured in a manner that suppresses EMI/RFI emissions. One technique for affixing such panels uses a strip of conductive finger-like springs to form a wiping electrical contact between the panels and framework. Other techniques are also well understood in the art including welding individual panels together, or to the framework. It is also understood that a plurality of horizontally extending rails are formed along inner-surfaces of panels 128, 134 and 136 for supporting rack-mounted electrical/electronic components, such as components 12, 14 and 16.

An electromagnetic interference (EMI) barrier wall 100 is supported internally within enclosure 110 such that an interior volume of enclosure 110 is subdivided into a first component EMI enclosure and a second component EMI enclosure. The first component EMI enclosure encases individual components 12–14 so as to form a component enclosure 108, and the second component EMI enclosure encases the cooling fan module so as to form a cooling fan module enclosure 109. Component enclosure 108 is formed between a first portion of enclosure 110 and EMI barrier wall 100. Likewise, cooling fan module enclosure 109 is formed between a second, remaining portion of enclosure 110 and barrier 100. For purposes of this disclosure and claim language interpretation, it is understood that the term "EMI barrier" refers to a barrier that blocks transmission of one or both of EMI and RFI emissions.

According to one construction, EMI barrier wall 100 is affixed to the interior of enclosure 110 via one or more continuous welds so as to prevent EMI transmission from between wall 100 and enclosure 110. Alternatively, EMI barrier wall 100 is secured within enclosure 110 on a rack (not shown) and with an EMI gasket, according to one of the well-understood constructions already understood in the art. Further alternatively, barrier wall 100 is formed by a wall portion of a cooling fan module.

As shown in FIG. 3, EMI barrier wall 100 includes a horizontal wall 102 and a contiguous vertical wall 104.

Walls 102 and 104 each include a relatively large area of relatively small sized apertures 106, each sized sufficiently to contain relatively high frequency EMI/RFI emissions within component enclosure 108. Cooling fan module 118 is supported above barrier wall 100 so as to provide an air plenum 124 therebetween operative to facilitate extraction of cooling air flow from within plenum 124 and through vertical wall 104. Otherwise, EMI/RFI emissions will escape through cooling fan module enclosure 109 and out through the larger sized apertures 156 that are provided along enclosure 109 in order to enable a sufficient flow of cooling air through storage enclosure 110. Alternatively, EMI barrier wall 100 can be formed from one or more pieces of perforated metal screen having apertures corresponding to the relative size of apertures 106.

In operation, EMI barrier wall 100 segregates cooling fan module 118 outside of a relatively high frequency EMI chamber 112 comprising component enclosure 108. Accordingly, relatively high frequency EMI/RFI emissions emanating from components 12–14 therein are contained within a cooling fan module chamber 114 comprising component enclosure 108. At the same time, larger sized exhaust apertures 156 are provided in adjacent cooling fan module enclosure 109 which exit storage enclosure 110.

Also shown in FIG. 3, a plurality of relatively small sized inlet apertures 120 are formed in front panel 126; namely, in individual face panels 22. Apertures 120 allow cooling air to be drawn from outside enclosure 110 and through front panel 126 via inlet air flow paths 138, 140 and 142. Apertures 120 are sized sufficiently to prevent passage of EMI/RFI emissions from within component enclosure 108. Additionally, cooling fan module 118 contains a motor-driven fan that draws air through inlet apertures 120, within individual components 12–16, exiting components 12–16 via outlet air flow paths 144, 146 and 148, and into a common air plenum 126. Cooling fan module 118 then draws air from within plenum 124, via a cooling module flow path 150, and forces the drawn air out back panel 128 of enclosure 110 via a common outlet flow path 152 provided by the plurality of relatively large sized exhaust apertures 156. Relatively large sized exhaust apertures 156 are sized sufficiently to prevent passage of the relatively lower frequency EMI/RFI emissions that are generated by operation of a cooling fan contained within cooling fan module 118, yet provide for a relatively unrestricted flow of cooling air.

FIG. 4 illustrates the novel storage enclosure 110 of FIG. 3 in vertical-sectional view taken lengthwise. A fan inlet port 158 is shown communicating with a relatively large air plenum 124 that is formed in an inner portion of enclosure 110, behind components 12–16. The flow of cooling air through enclosure 110, as moved by fan module 118, is clearly shown in FIG. 4. Cool air is drawn into enclosure 110, and into individual components 12–16 via inlet paths 138, 140 and 142. Apertures (not shown) are provided in the rear of each component 12–16 such that cooling air, now slightly heated, leaves components 12–16 via outlet paths 144, 146 and 148 and enters a common enclosure or air plenum 124. Cooling fan module 118 withdraws the slightly heated cooling air from plenum 124, through apertures 106 in barrier wall 100, through port 158, and ejects the air from enclosure 110 via the plurality of relatively large sized exhaust apertures 156 formed in back panel 128, adjacent cooling fan module 118.

Pursuant to the construction of enclosure 110 that is depicted in FIGS. 3 and 4, an electromagnetic interference (EMI) barrier 154 is provided within enclosure 110. Inlet apertures 120 and barrier apertures 106 are dimensioned with a size that prevents escape of undesirable frequencies of electromagnetic interference (EMI) and radio-frequency interference (RFI) from component enclosure 108. For example, smaller aperture sizes are needed to prevent escape of higher frequency components emanating from electromagnetic fields generated by operating components contained within enclosure 110. The escape of such high frequency components, or the escape of any electromagnetic/radio-frequency waves, can interfere with the operation of other electrical/electronic equipment that is adjacent to, but outside of, enclosure 110. Accordingly, it is well understood in the art to appropriately size inlet apertures 120 and barrier wall apertures 156 so as to prevent escape of undesirable EMI/RFI components.

As shown in FIG. 4, an EMI barrier 154 is formed by the panels and EMI barrier wall 100 defining EMI chamber 112. EMI barrier 154 is shown simplistically, and is understood to be formed from the external surfaces of storage enclosure 110 and EMI barrier wall 100, including face panels 22 of components 12–14. In operation, EMI barrier wall 100 forms a perforated metal EMI barrier that is permanently attached inside storage enclosure 110. Barrier wall 100, in effect, separates the fan module(s) 118 from high frequency modules/components 12–14 contained in EMI barrier 154; namely within EMI chamber 112 of storage enclosure 110.

Figure 2:
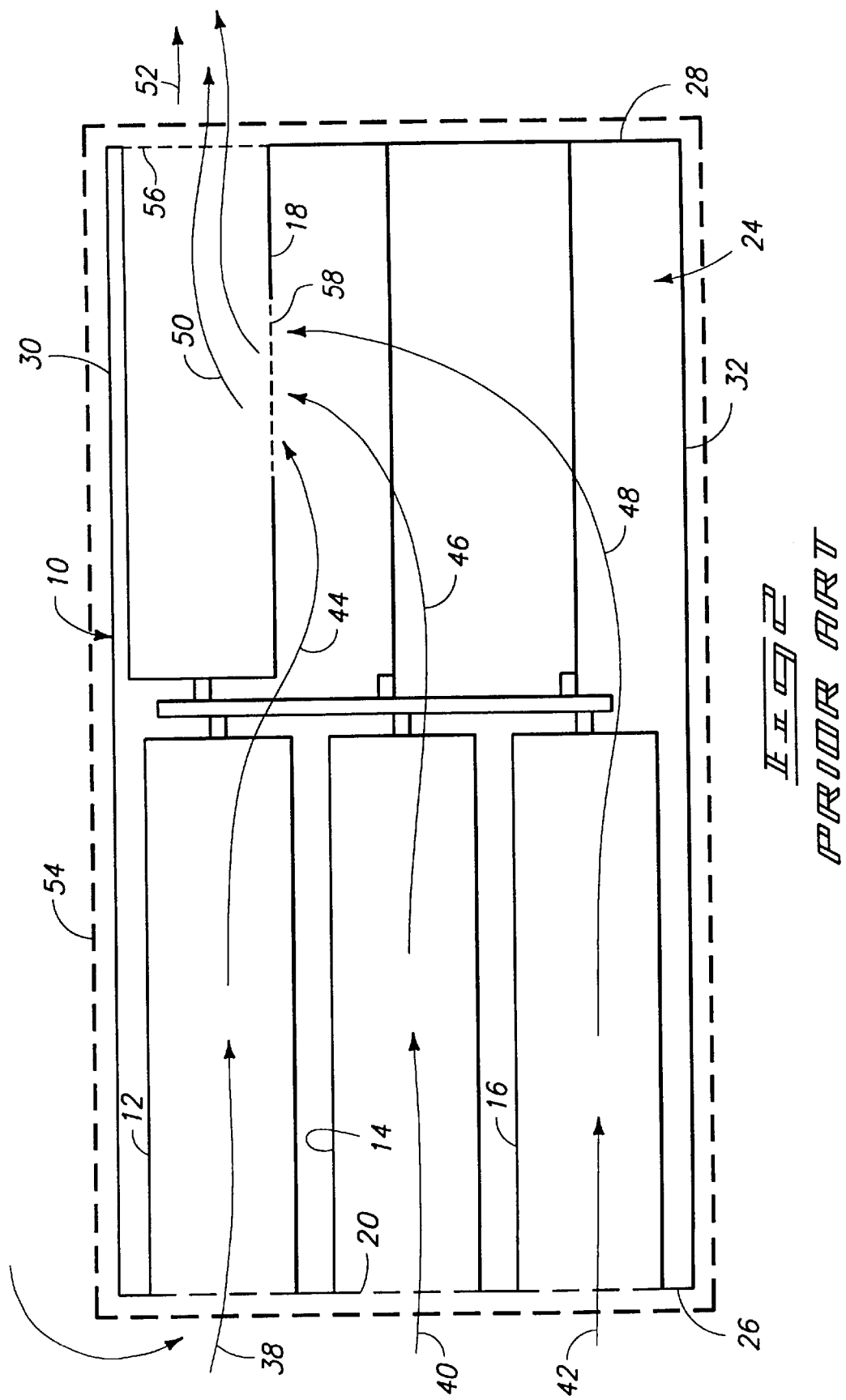
FIG. 2 is a simplified vertical-sectional view taken along line 2—2 of FIG. 1.

With the construction depicted in FIGS. 3 and 4, an electric motor driven fan (not shown) within cooling fan module 118 pushes air through relatively large sized exhaust apertures 156, which form a relatively large outlet area that is more efficient and effective than trying to push cooling air through a relatively small group of relatively small sized and more restrictive exhaust apertures, such as exhaust apertures 56 (of FIGS. 1 and 2). Accordingly, exhaust apertures 156 from fan module 118 are sized sufficiently large with respect to the apertures 106 and 120 in EMI barrier 154, as they now only need to contain the relatively lower frequencies generated from within fan module(s) 118. Additionally, it is relatively easier to pull air through the large number of relatively small sized apertures 106 than it would be to push air through apertures 56 (of FIG. 1).

Additionally, it is assumed that any cables, wires, and communications lines that exit storage enclosure 110 use presently understood constructions for preventing higher frequency signals comprising higher frequency EMI/RFI emissions from emanating from storage enclosure 110, and possibly into the fan module 118 and outside of enclosure 110 via relatively large exhaust apertures 156.

One exemplary construction for enclosure 110 of FIG. 3 is formed from sheet metal having apertures 106 and 120 sized to have a three-millimeter diameter, and apertures 156 sized with a 15-millimeter diameter. It is presently understood that a three-millimeter diameter aperture 106 and 120 protects fundamental frequencies up to 1 GHz, and a 15-millimeter aperture protects fundamental frequencies up to 100 MHZ. Such sizes for apertures 106, 120 and 156 provide one suitable solution when utilized with Applicant's invention. Optionally, apertures 106 and 120 can be sized to have a six-millimeter diameter wherein such apertures are formed as a wave guide having a significant depth so as to protect for fundamental frequencies up to 1 GHz. Furthermore, it is understood that apertures 106, 120 and 156 can be formed to have other shapes such as elliptical, square, or star-shaped such that the maximum dimension protects passage of a fundamental frequency.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

What is claimed is:

1. A storage enclosure for electrical/electronic components, comprising:
    an enclosure configured to house an electrical/electronic component;
    an EMI barrier wall having air flow apertures sized sufficiently small to prevent passage of undesirable relatively high frequency EMI/RFI emissions, the barrier wall supported internally of the enclosure and configured to subdivide the enclosure into a component enclosure and a cooling fan module enclosure;
    air flow inlet apertures provided in the component enclosure to pass cooling air into the component enclosure and cool components contained therein;
    exhaust air flow apertures sized larger than the EMI barrier apertures and the air flow inlet apertures, and provided in the cooling fan module enclosure to pass cooling air from the cooling fan module enclosure and out of the storage enclosure;
    wherein the component enclosure is configured to contain relatively high frequency EMI/RFI emissions that emanate from components contained therein, and the cooling fan module enclosure is configured to contain relatively low frequency EMI/RFI emissions that emanate from a cooling fan module contained therein while providing for a relatively large passage of cooling air from the storage enclosure.

2. The storage enclosure of claim 1 further comprising a cooling fan module carried within the cooling fan module enclosure.

3. The storage enclosure of claim 2 wherein an air plenum is provided between the EMI barrier wall and the cooling fan module.

4. The storage enclosure of claim 1 wherein the storage enclosure comprises an equipment cabinet configured to receive rack mounted electrical/electronic components therein.

5. The storage enclosure of claim 1 wherein the EMI barrier wall comprises a perforated sheet of metal in which the air flow apertures are formed.

6. The storage enclosure of claim 5 wherein the sheet of metal comprises a horizontal wall and a vertical wall formed contiguously with the horizontal wall.

7. The storage enclosure of claim 1 wherein a first portion of the storage enclosure cooperates with the barrier wall to form the component enclosure.

8. The storage enclosure of claim 1 wherein the barrier wall and a remaining portion of the storage enclosure cooperate to form the cooling fan module enclosure.

9. An electromagnetic interference (EMI) shield for electrical components, comprising:
    an enclosure;
    a barrier wall supported internally of the enclosure so as to subdivide the enclosure into a component enclosure and a fan module enclosure;
    apertures provided in the enclosure and the barrier wall to allow cooling air to be drawn in from outside of the enclosure through the component enclosure and out through the fan module enclosure;
    wherein a first set of the apertures in the component enclosure and the barrier wall are sized smaller than a second set of the apertures in the fan module enclosure.

10. The shield of claim 9 wherein the barrier wall comprises a perforated sheet of metal in which air flow apertures are formed.

11. The shield of claim 9 wherein the barrier wall comprises a sheet of metal including a horizontal wall and a vertical wall formed contiguously with the horizontal wall, the apertures provided within the horizontal wall and the vertical wall.

12. The shield of claim 9 further comprising a cooling fan module carried within the fan module enclosure.

13. The shield of claim 12 further comprising an electrical component carried within the component enclosure.

14. The shield of claim 12 wherein an air plenum is provided between the barrier wall and the cooling fan module.

15. The shield of claim 9 wherein the enclosure comprises an EMI storage enclosure including a plurality of panels supported together in a manner that suppresses EMI/RFI emissions.

16. The shield of claim 9 wherein the component enclosure comprises a rack-mounted storage enclosure.

17. A method for shielding electrical components contained within an EMI cabinet, comprising:
    providing an EMI cabinet having relatively small sized apertures configured to pass cooling air into the EMI cabinet and relatively large sized apertures configured to pass cooling air from the EMI cabinet;
    providing a barrier wall within the EMI cabinet having relatively small sized apertures, the barrier wall configured to subdivide the EMI cabinet into a component enclosure and a fan module enclosure; and
    providing an electrical component within the component enclosure and a fan module within the fan module enclosure;
    wherein the relatively small sized apertures in the component enclosure of the EMI cabinet and the barrier wall are sized to contain relatively high-frequency noise emanating from the electrical component, and the relatively large sized apertures in the fan module enclosure of the EMI cabinet are sized to contain relatively lower-frequency noise emanating from the fan module while also providing sufficient air flow for evacuating cooling air from the EMI cabinet.

18. The method of claim 17 wherein the barrier wall comprises a perforated sheet of metal having relatively small sized airflow apertures formed therein.

19. The method of claim 18 wherein the sheet of metal includes a horizontal wall and a vertical wall formed contiguously with the horizontal wall.

20. The method of claim 17 wherein the barrier wall and the EMI cabinet cooperate to form the component enclosure and the fan module enclosure, the relatively small sized apertures formed within the component enclosure for drawing a flow of cooling air therethrough and the relatively large sized apertures provided in the fan module enclosure for drawing a flow of cooling airflow from the fan module enclosure and out of the EMI cabinet.

* * * * *